United States Patent
Vice

(10) Patent No.: US 7,363,019 B2
(45) Date of Patent: Apr. 22, 2008

(54) SHAPING THE DRIVE SIGNAL OF A MIXING DEVICE

(75) Inventor: Michael W. Vice, El Granada, CA (US)

(73) Assignee: Avago Technologies Wireless IP Pte Ltd, Singapore (SG)

( * ) Notice: Subject to any disclaimer, the term of this patent is extended or adjusted under 35 U.S.C. 154(b) by 610 days.

(21) Appl. No.: 10/639,177

(22) Filed: Aug. 11, 2003

(65) Prior Publication Data

US 2005/0037725 A1    Feb. 17, 2005

(51) Int. Cl.
*H04B 15/06* (2006.01)
*H04B 17/00* (2006.01)

(52) U.S. Cl. .................. 455/317; 455/115.1; 455/323; 455/338; 375/285

(58) Field of Classification Search ................ 455/317, 455/323, 324, 326, 338, 319, 115.1, 102, 455/103, 126, 127, 110, 129; 327/113, 114, 327/116, 119; 375/285, 346, 350
See application file for complete search history.

(56) References Cited

U.S. PATENT DOCUMENTS

| 4,680,778 | A  | * | 7/1987  | Krinock ....................... 375/344 |
| 6,108,529 | A  | * | 8/2000  | Vice et al. ................... 455/323 |
| 6,704,549 | B1 | * | 3/2004  | Sorrells et al. ............. 455/102 |
| 6,803,829 | B2 | * | 10/2004 | Duncan et al. ............... 331/34  |
| 7,034,733 | B2 | * | 4/2006  | Dedic et al. ................ 341/150 |

* cited by examiner

*Primary Examiner*—Tony T. Nguyen

(57) ABSTRACT

Techniques for shaping the drive signal of a mixing device to overcome a characteristic capacitance of the control terminal of the mixing device and reduce the time the mixing device is in an intermediate state between its on and off states.

14 Claims, 2 Drawing Sheets

SHAPING THE DRIVE SIGNAL OF A MIXING DEVICE

BACKGROUND

Mixers may be employed in a wide variety of electronic systems. For example, mixers may be used for frequency conversion in a variety of systems including radio systems. Examples of mixing devices that may be employed in a mixer include varieties of field effect transistors (FETs) and bipolar junction transistors (BJTs).

A mixing operation in a mixer may include periodically switching a mixing device between its two conductions states. For example, an FET or BJT mixing device may be periodically switched between its on state and its off state during a mixing operation.

A mixing device may be switched between its on and off states by applying a periodic drive signal to a control terminal of the mixing device. For example, a sine wave or square wave drive signal may be applied across the gate and the source of an FET mixing device to periodically switch the FET between its on and off states. Similarly, a sine wave or square wave drive signal may be applied to across the base and the emitter of a BJT mixing device to periodically switch the BJT between its on and off states.

A control terminal of a mixing device may exhibit electrical characteristics that hinder the switching of the mixing device between its on and off states. For example, the gate of an FET or the base of a BJT may have a characteristic capacitance. The characteristic capacitance of a mixing device may rise as the voltage on the control terminal of the mixing device rises toward a threshold voltage level that switches the mixing device to its on state. The rising characteristic capacitance may limit the speed at which a mixing device may be switched between its on and off states, thereby increasing the time that the mixing device is in an intermediate state between its on and off states. Unfortunately, an increase in the amount of time spent in an intermediate state between its on and off states may cause a mixing device to exhibit an increase in signal loss and signal distortion.

SUMMARY OF THE INVENTION

Techniques are disclosed for shaping the drive signal of a mixing device to overcome a characteristic capacitance of the control terminal of the mixing device and reduce the time the mixing device is in an intermediate state between its on and off states. The present techniques may be used to reduce the square wave corner rounding caused by device control terminal capacitance while simultaneously providing a temperature compensated optimal DC bias for the mixing device control terminal.

Other features and advantages of the present invention will be apparent from the detailed description that follows.

BRIEF DESCRIPTION OF THE DRAWINGS

The present invention is described with respect to particular exemplary embodiments thereof and reference is accordingly made to the drawings in which.

DETAILED DESCRIPTION

Figure 1:
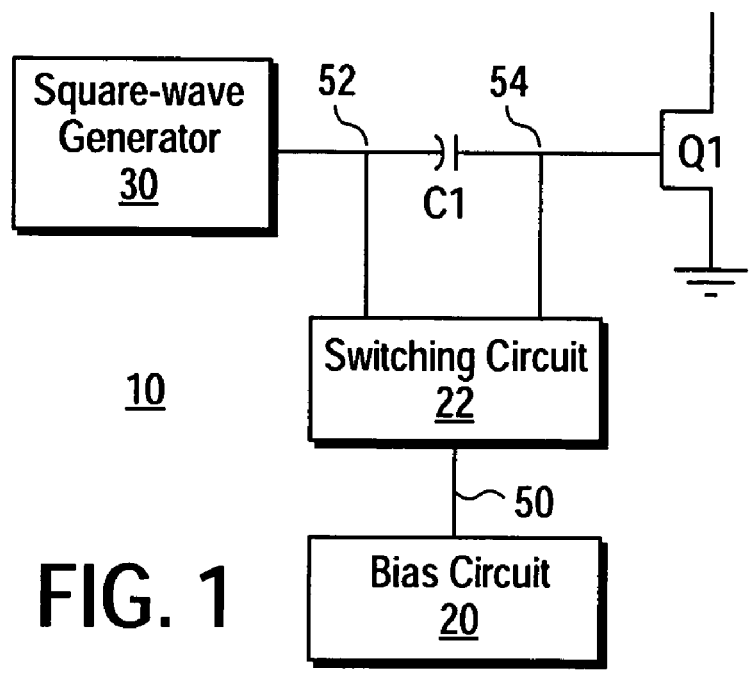
FIG. 1 shows a mixer according to the present teachings.

FIG. 1 shows a mixer 10 according to the present teachings. The mixer 10 includes a transistor Q1 that functions as a mixing device. The control terminal of the transistor Q1 is driven by a square-wave generator 30. In one embodiment, the transistor Q1 is an FET and its control terminal is its gate. Alternatively, the transistor Q1 may be a BJT and its control terminal its base.

The mixer 10 includes a bias circuit 20 and a switching circuit 22 that provide drive shaping according to the present techniques. The bias circuit 20 generates a voltage at a node 50 that sets the maximum voltage level that may be obtained at the gate of the transistor Q1 (node 54). The bias circuit 20 is arranged so that the voltage level at the node 50 temperature tracks with the changes in the voltage (Vf) at which the gate of the transistor Q1 begins to draw forward electrical current. The switching circuit 22 senses the output signal of the square-wave generator 30 at a node 52 and switches on to provide electrical current into the gate of the transistor Q1 to overcome the characteristic capacitance of the gate of the transistor Q1 as the voltage at the gate of the transistor Q1 reaches its maximum value as set by the bias circuit 20.

Figure 2:
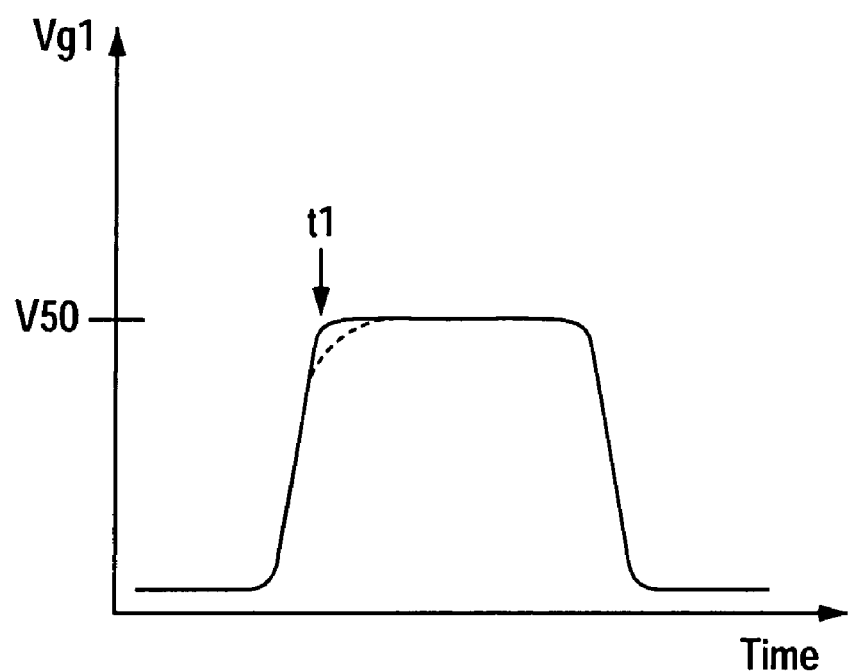
FIG. 2 illustrates the voltage at the control terminal of a mixing device according to the present teachings.

FIG. 2 illustrates the voltage (Vg1) at the gate of the transistor Q1. The overall voltage Vg1 over time forms a square-wave that is clamped to the voltage level (V50) at the node 50. As the voltage Vg1 rises the characteristic capacitance of the gate of the transistor Q1 rises. The dotted line shows the rounding of the square-wave voltage at the gate of the transistor Q1 that would otherwise occur in the absence of circuitry according to the present techniques. Instead, at time t1 the switching circuit 22 switches on and provides electrical current into the gate of the transistor Q1, thereby causing a faster rise in Vg1 as illustrated by the solid line.

Figure 3:
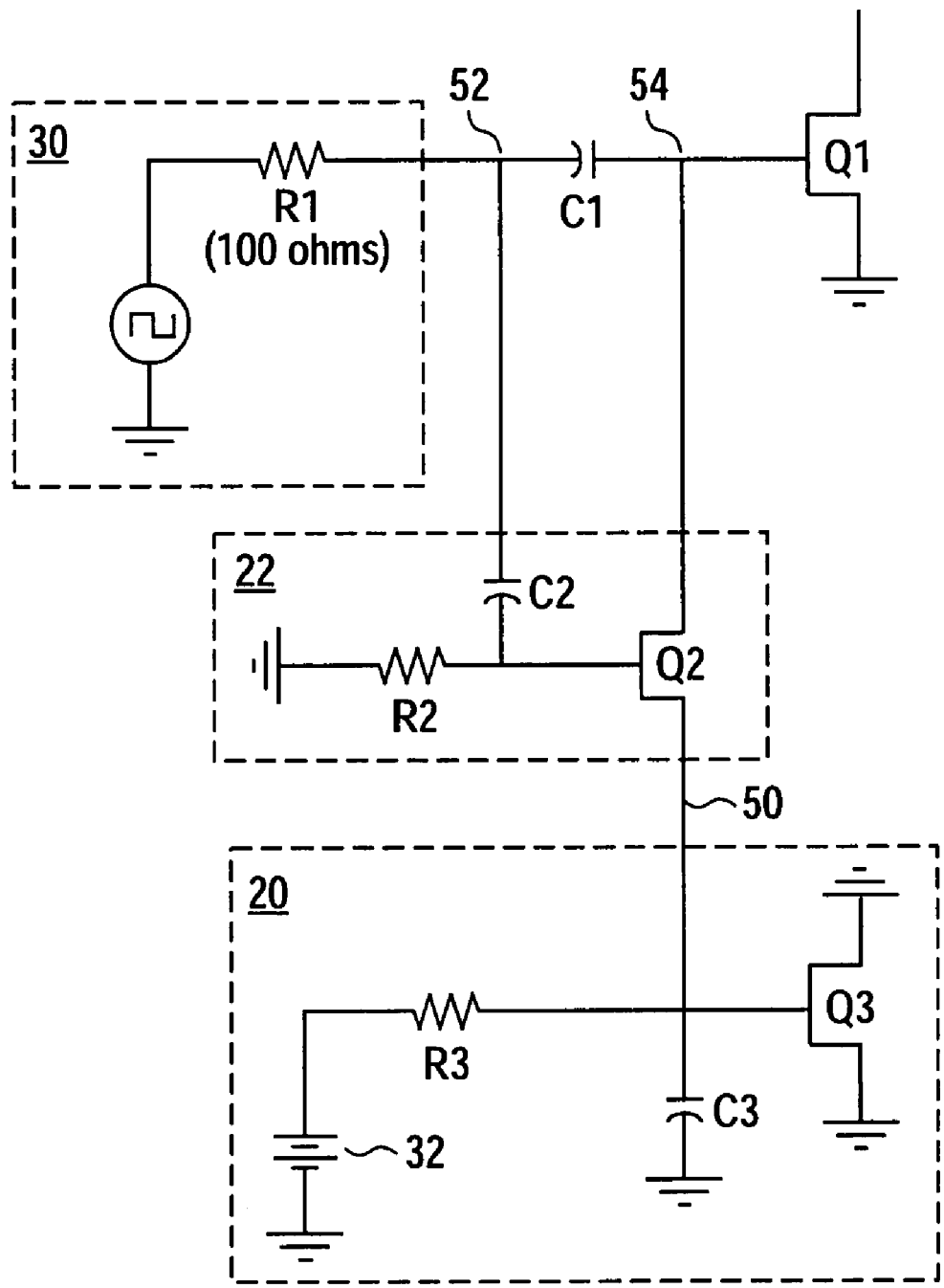
FIG. 3 shows embodiments of a bias circuit and a switching circuit according to the present teachings.

FIG. 3 shows embodiments of the bias circuit 20 and the switching circuit 22 according to the present teachings. The bias circuit 20 includes a voltage source 32, a resistor R3, a transistor Q3, and a capacitor C3. The switching circuit 22 includes a resistor R2, a transistor Q2, and a capacitor C2.

The voltage source 32 and the resistor R3 together provide a source that injects electrical current into the gate of the transistor Q3. The transistor Q3 may be a junction FET, e.g. a pHEMT. The gate of the transistor Q3 forms a diode with its channel. This yields a voltage at the gate of the transistor Q3 that is at or near its gate Vf. This is used to set the maximum voltage that may be obtained at the gate of the transistor Q1. This prevents excessive current consumption by the transistor Q1. The resistor R3 is selected to have a relatively large resistance value (e.g. 5K Ohm) so that the transistors Q1 and Q3 consume relatively small amounts of electrical current. The selection of a relatively large value for R3 provides a voltage at the gate of the transistor Q3 (Vg3) representing the threshold voltage for gate conduction of both of the transistors Q3 and Q1.

The transistor Q3 may be formed using the same process technology that is used to form the transistor Q1. The transistor Q3 may be substantially smaller than the transistor Q1.

The transistor Q2 in the switching circuit 22 switches the voltage on the gate of the transistor Q3 to the gate of the transistor Q1 at the time the square-wave voltage reaches its maximum. The transistor Q2 like the transistor Q1 is driven by the output of the square-waved generator 30 but through the capacitor C2 which is substantially smaller (e.g. 0.1 pF) than the capacitor C1 (e.g. 5 pF) at the gate of the transistor Q1. A rise in the voltage at the node 52 causes a large dv/dt current in the capacitor C2 as a consequence of the rapid change in voltage at the node 52 from the square-wave generator 30. This creates a current pulse into the gate of the transistor Q2, switching it on, and causing the gate of the transistor Q1 to have the same voltage as the gate of the transistor Q3. The boost in charge, particularly charge that is stored in the capacitor C3 which is a relatively large capacitor (e.g. 10 pF), provides charge to the gate of the transistor Q1 and overcomes its increasing capacitance at the peak of the square-wave drive signal.

When the square-wave drive signal from the square-wave generator 30 falls, the transistor Q2 quickly switches off so that it provides no substantial resistance to the fall of Vg1.

Given that the transistor Q3 is a smaller version of the transistor Q1 and that they are formed with the same process technology, the gate Vf of the transistor Q3 temperature tracks with the gate Vf of the transistor Q1. Vg3 is temperature compensated because the gate conduction threshold voltage for the transistors Q3 and Q1 track each other over temperature. Vg3 is a desirable square wave drive maximum voltage because it is the maximum gate voltage for the transistor Q1 that will not result in substantial gate current. The capacitor C3 increases the instantaneous current delivery capability of the bias circuit 20 and is selected to be large enough to meet the required current of the gate of the transistor Q1.

The size of the transistor Q2 may be chosen large enough to convey the required current from the capacitor C3 to the gate of Q1—but no larger. The capacitor C2 and the resistor R2 are chosen to permit proper operation of transistor Q2 according to the period of the drive waveform from the square-wave generator 30.

The current source function of the resistor R3 may be replaced with any number of more sophisticated active current sources.

The transistors Q1-Q3 may be FETs or BJTs. Examples include a junction FET (JFET), a metal-semiconductor FET (MESFET), a high electron mobility transistor (HEMT), a pseudo-morphic high electron mobility transistor (pHEMT), a metal-oxide-semiconductor FET (MOSFET), and a homo-junction/hetero-junction transistor (HBT).

The mixer 10 benefits from a relatively high conversion efficiency and linearity in frequency mixing operations in comparison with prior mixers. In addition, the mixer 10 provides a high performance mixing operations with less local oscillator input power, or less DC power, or both, in comparison to prior mixers.

The foregoing detailed description of the present invention is provided for the purposes of illustration and is not intended to be exhaustive or to limit the invention to the precise embodiment disclosed. Accordingly, the scope of the present invention is defined by the appended claims.

What is claimed is:

1. A mixer, comprising:
   a mixing device having a control terminal for switching the mixing device in response to a drive signal;
   a circuit for shaping the drive signal to overcome a characteristic capacitance of the control terminal when switching the mixing device;
   wherein the circuit for shaping includes a bias circuit that generates a bias signal for clamping the drive signal to a switching level for the mixing device; and
   wherein the bias circuit supplies a current pulse for shaping the drive signal.

2. The mixer of claim 1, wherein the circuit for shaping is arranged to track the temperature changes of the mixing device.

3. The mixer of claim 1, further comprising a switching circuit for switching the bias signal to the control terminal in response to the drive signal.

4. The mixer of claim 3, wherein the switching circuit switches the bias signal to the control terminal when the drive signal approaches a peak amplitude.

5. A mixer, comprising:
   a mixing device;
   a drive signal generator for applying a drive signal to a control terminal of the mixing device;
   a circuit for shaping the drive signal to overcome a characteristic capacitance of the control terminal;
   wherein the circuit for shaping comprises:
     a bias circuit for generating a bias signal for clamping the drive signal to a switching level for the mixing device; and
     a switching circuit for switching the bias signal to the control terminal in response to the drive signal; and
   wherein the bias circuit supplies a current pulse for shaping the drive signal.

6. The mixer of claim 5, wherein the switching circuit includes a device having a threshold voltage that temperature tracks with a threshold voltage of the mixing device.

7. The mixer of claim 5, wherein the switching circuit switches the bias signal to the control terminal when the drive signal approaches a peak amplitude.

8. The mixer of claim 5, wherein the drive signal generator is a square-wave generator.

9. The mixer of claim 5, wherein the mixing device is a transistor.

10. A method for switching a mixing device in a mixer, said method comprising:
    shaping a drive signal applied to the mixing device to overcome a characteristic capacitance of a control terminal of the mixing device; and
    wherein the shaping includes generating a current pulse for shaping the drive signal.

11. The method of claim 10, wherein the shaping includes tracking a temperature change of the mixing device.

12. The method of claim 10, wherein the shaping includes generating a bias signal for clamping the drive signal to a switching level for the mixing device.

13. The method of claim 12, wherein the shaping includes switching the bias signal to the control terminal in response to the drive signal.

14. The method of claim 12, wherein the shaping includes switching the bias signal to the control terminal when the drive signal approaches a peak amplitude.

* * * * *